US012184251B2

United States Patent
Peng et al.

(10) Patent No.: US 12,184,251 B2
(45) Date of Patent: Dec. 31, 2024

(54) BIAS CIRCUIT AND AMPLIFIER DEVICE

(71) Applicant: RichWave Technology Corp., Taipei (TW)

(72) Inventors: Tien-Yun Peng, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 502 days.

(21) Appl. No.: 17/535,701

(22) Filed: Nov. 26, 2021

(65) Prior Publication Data

US 2022/0173707 A1 Jun. 2, 2022

Related U.S. Application Data

(60) Provisional application No. 63/118,744, filed on Nov. 27, 2020.

(30) Foreign Application Priority Data

Nov. 22, 2021 (TW) .................. 110143374

(51) Int. Cl.
| | |
|---|---|
| *H03F 3/45* | (2006.01) |
| *G05F 1/46* | (2006.01) |
| *H03F 3/04* | (2006.01) |

(52) U.S. Cl.
CPC ........... *H03F 3/45475* (2013.01); *G05F 1/46* (2013.01); *H03F 2200/451* (2013.01)

(58) Field of Classification Search
CPC .......... H03F 3/45475; H03F 2200/451; H03F 3/345; H03F 2200/18; H03F 2200/408;
(Continued)

(56) References Cited

U.S. PATENT DOCUMENTS 5,847,556 A 12/1998 Kothandaraman
6,714,081 B1 * 3/2004 Xu ..................... H03F 1/301
330/296
(Continued)

FOREIGN PATENT DOCUMENTS

| CN | 103490771 A | 1/2014 |
| TW | 201603481 A | 1/2016 |

OTHER PUBLICATIONS

Jhon A. Gomez C. et al., 1.5 ppm/°C Nano-Watt Resistorless MOS-Only Voltage Reference, VII Latin American Symposium on Circuits and Systems (LASCAS), 2016, pp. 99-102, IEEE, XP032891528.
(Continued)

*Primary Examiner* — Hieu P Nguyen
(74) *Attorney, Agent, or Firm* — Winston Hsu

(57) ABSTRACT

A bias circuit includes a current mirror circuit, an operational amplifier, and a bias generating circuit. The current mirror circuit includes a reference branch circuit and at least one mirror branch circuit. The reference branch circuit generates a reference current according to a base current, and the at least one mirror branch circuit generates at least one mirrored current according to the reference current. The operational amplifier receives a first voltage from the reference branch circuit and a second voltage from the at least one mirror branch circuit, and adjusts the first voltage by generating a control voltage according to the second voltage. The bias generating circuit is coupled to the at least one mirror branch circuit and generates a bias signal according to the at least one mirrored current.

17 Claims, 7 Drawing Sheets

(58) Field of Classification Search
CPC ........ H03F 2200/516; H03F 3/19; H03F 1/30;
G05F 1/46; G05F 3/262; G05F 3/26
USPC ........................................ 330/285, 296, 288
See application file for complete search history.

(56) References Cited

U.S. PATENT DOCUMENTS

| | | |
|---|---|---|
| 8,618,862 B2 | 12/2013 | Nadimpalli |
| 2004/0046609 A1 | 3/2004 | Xu |
| 2007/0164721 A1 | 7/2007 | Han |
| 2008/0284501 A1 | 11/2008 | Kim |
| 2009/0085549 A1 | 4/2009 | Sengupta |
| 2017/0019082 A1 | 1/2017 | Ishihara |
| 2019/0068131 A1 | 2/2019 | Ishihara |
| 2019/0267948 A1 | 8/2019 | Su |
| 2019/0280658 A1 | 9/2019 | Morisawa |
| 2019/0386620 A1 | 12/2019 | Wang |

OTHER PUBLICATIONS

European search report issued on Apr. 19, 2022 for the EP application No. 21210672.8, filing date Nov. 26, 2021, pp. 1-32.
Office action mailed on May 30, 2022 for the Taiwan application No. 110143374, filing date Nov. 22, 2021, pp. 1-9.

* cited by examiner

__US 12,184,251 B2__

BIAS CIRCUIT AND AMPLIFIER DEVICE

CROSS REFERENCE TO RELATED APPLICATION

This non-provisional application claims priority of U.S. provisional patent application No. 63/118,744, filed on 27 Nov., 2020, included herein by reference in its entirety.

TECHNICAL FIELD

The present invention relates to a bias circuit, and in particular, to a bias circuit capable of generating a stable bias signal according to a mirrored current.

BACKGROUND

Ideally, a voltage source is used to provide a reference voltage at a fixed level, so that a bias circuit may generate a bias signal according to the reference voltage. However, due to uncontrollable variations in the manufacturing process or other factors, the level of the reference voltage may vary, affecting stability of the bias signal.

SUMMARY

According to an embodiment of the invention, a bias circuit includes a current mirror circuit, an operational amplifier and a bias generation circuit. The current mirror circuit includes a reference branch circuit and at least one mirror branch circuit. The reference branch circuit is used to generate a reference current according to a base current. The at least one mirror branch circuit is used to generate at least one mirrored current according to the reference current. The operational amplifier is coupled to the reference branch circuit and the at least one mirror branch circuit, and is used to receive a first voltage and a second voltage, and generate a control voltage according to the second voltage, the control voltage being used to adjust the first voltage. The bias generation circuit is coupled to the at least one mirror branch circuit and is used to generate a bias signal according to the at least one mirrored current. The first voltage is a voltage at the reference branch circuit, and the second voltage is a voltage at the at least one mirror branch circuit or an adjusted voltage thereof.

According to another embodiment of the invention, an amplifier device includes a first bias circuit, an input terminal, an output terminal and a first amplifier. The first bias circuit includes a first current mirror circuit, a first operational amplifier and a first bias generation circuit. The first current mirror circuit is used to receive a first reference voltage, and includes a first reference branch circuit and at least one first mirror branch circuit. The first reference branch circuit is used to generate a first reference current according to a first base current. The at least one first mirror branch circuit is used to generate at least one first mirrored current according to the first reference current. The first operational amplifier is coupled to the first reference branch circuit and the at least one first mirror branch circuit, and is used to receive a first voltage and a second voltage, and generate a first control voltage according to the second voltage. The first control voltage is used to adjust the first voltage. The first bias generation circuit is coupled to the at least one first mirror branch circuit and is used to generate a first bias signal according to the at least one first mirrored current. The first voltage is a voltage at the first reference branch circuit, and the second voltage is a voltage at the at least one first mirror branch circuit or an adjusted voltage thereof. The input terminal is used to receive a radio frequency signal. The output terminal is used to output an amplified radio frequency signal. The first amplifier is coupled between the input terminal of the amplifier device and the output terminal of the amplifier device, and is used to receive the first bias signal and amplify the radio frequency signal.

DETAILED DESCRIPTION

Figure 1:
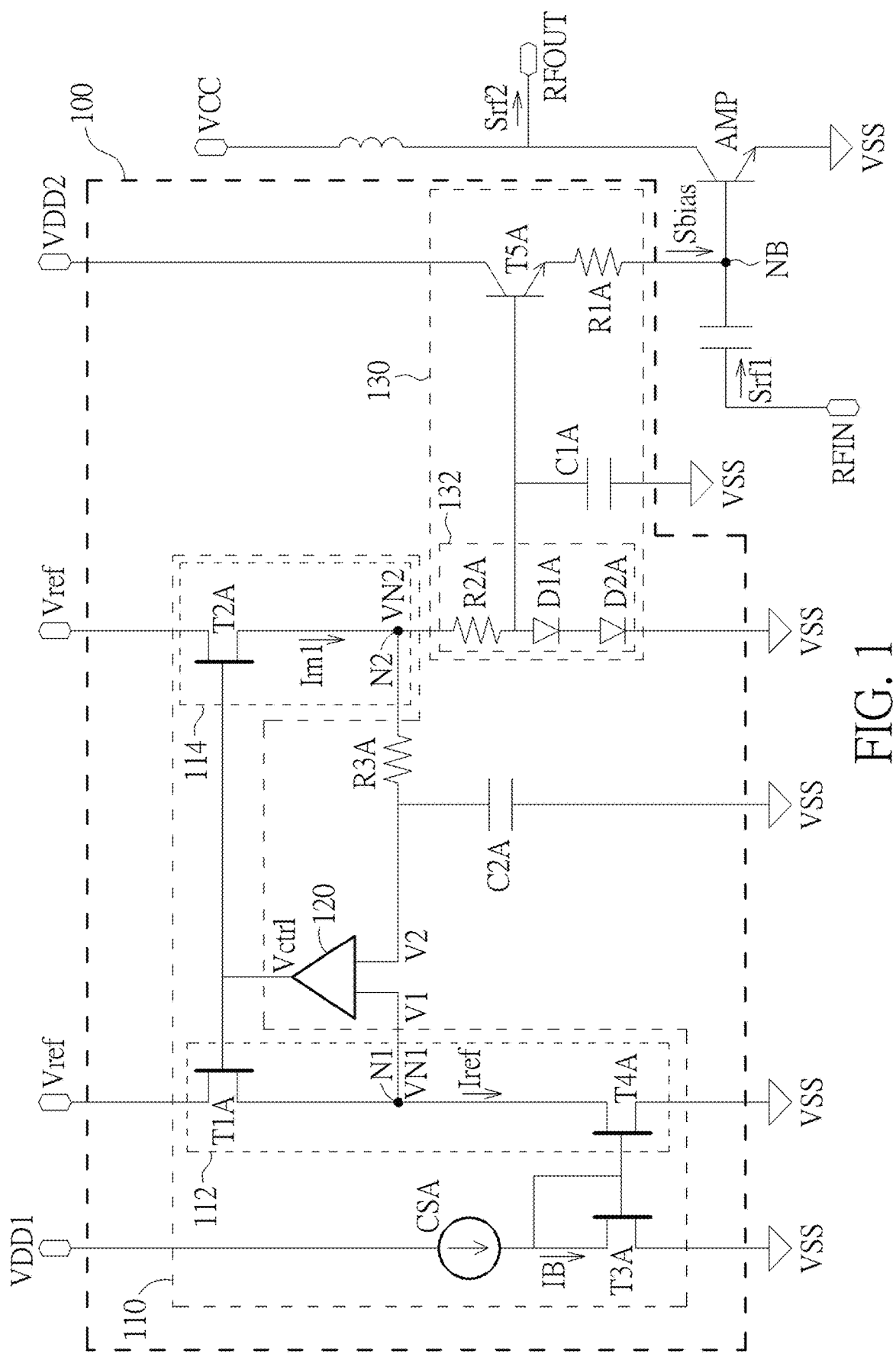
FIG. 1 is a schematic diagram of a bias circuit according to an embodiment of the invention.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like elements throughout.

FIG. 1 is a schematic diagram of a bias circuit 100 according to an embodiment of the invention. The bias circuit 100 includes a current mirror circuit 110, an operational amplifier 120, and a bias generation circuit 130.

The current mirror circuit 110 may include a reference branch circuit 112 and a mirror branch circuit 114. The reference branch circuit 112 may generate a reference current Iref according to a base current IB, and the mirror branch circuit 114 may generate a mirrored current Im1 according to the reference current Iref.

The operational amplifier 120 may be coupled to the reference branch circuit 112 and the mirror branch circuit 114 to receive a first voltage V1 and a second voltage V2, and may generate a control voltage Vctrl according to the second voltage V2 to adjust the first voltage V1, bringing the first voltage V1 and the second voltage V2 to an equal level. In some embodiments, the first voltage V1 may be a voltage at the reference branch circuit 112, and the second voltage V2 may be a voltage at the mirror branch circuit 114 or an adjusted voltage thereof. The bias generation circuit 130 may be coupled to the mirror branch circuit 114, and may generate a bias signal Sbias according to the mirrored current Im1.

In some embodiments, the bias generation circuit 130 may provide the bias signal Sbias to an amplifier AMP. For example, the amplifier AMP may amplify a radio frequency (RF) signal Srf1 from an input terminal RFIN to output an amplified RF signal Srf2 to an output terminal RFOUT, and the bias generation circuit 130 may output the bias signal Sbias to a bias terminal NB of the amplifier AMP, thereby properly biasing the amplifier AMP to maintain the performance thereof In some embodiments, the bias signal Sbias may be a current signal.

In FIG. 1, the current mirror circuit 110 may further include a current source C SA and a transistor T3A, and the reference branch circuit 112 may include a node N1, and transistors T1A and T4A. The current source CSA may be coupled to an operation voltage terminal VDD1 to generate the base current IB. The transistor T3A has a first terminal, a second terminal, and a control terminal. The first terminal of the transistor T3A may be coupled to the current source CSA to receive the base current IB, the second terminal of the transistor T3A may be coupled to a base voltage terminal VSS, and the control terminal of the transistor T3A may be coupled to the first terminal of the transistor T3A. The node N1 may be set between the transistors T1A and T4A. The transistor T1A has a first terminal, a second terminal, and a control terminal. The first terminal of the transistor T1A may be coupled to a reference voltage terminal Vref, and the second terminal of the transistor T1A may be coupled to the node N1. The transistor T4A has a first terminal, a second terminal, and a control terminal. The first terminal of the transistor T4A may be coupled to the node N1, the second terminal of the transistor T4A may be coupled to the base voltage terminal VSS, and the control terminal of the transistor T4A may be coupled to the control terminal of the transistor T3A. In other words, the transistors T3A and T4A may form a current mirror mirroring the base current IB to generate the reference current Iref.

In addition, the mirror branch circuit 114 may include a node N2 and a transistor T2A. The node N2 may be set between the transistor T2A and the bias generation circuit 130. The transistor T2A has a first terminal, a second terminal, and a control terminal. The first terminal of the transistor T2A may be coupled to the reference voltage terminal Vref, the second terminal of the transistor T2A may be coupled to the node N2, and the control terminal of the transistor T2A may be coupled to the control terminal of the transistor T1A. In this manner, the voltage difference between the control terminal and the first terminal of the transistor T1A may be substantially equal to the voltage difference between the control terminal and the first terminal of the transistor T2A, and the transistors T1A and T2A may form a current mirror mirroring the reference current Iref to generate the mirrored current Im1. In some embodiments, the sizes of the transistors T1A and T2A (that is, the width-to-length ratios of the transistors T1A and T2A) may be selected to adjust a ratio of the reference current Iref to the mirrored current Im1. For example, the size of the transistor T2A may be larger than the size of the transistor T1A, so that the mirrored current Im1 may be greater than the reference current Iref.

In FIG. 1, the operational amplifier 120 may have a first input terminal, a second input terminal, and an output terminal. The first input terminal of the operational amplifier 120 may be coupled to the node N1, the second input terminal of the operational amplifier 120 may be coupled to the node N2, and the output terminal of the operational amplifier 120 may be coupled to the control terminal of the transistor T1A and the control terminal of the transistor T2A. In FIG. 1, the first voltage V1 is a voltage VN1 at the node N1 (i.e., the voltage at the reference branch circuit 112), and the second voltage V2 is a voltage VN2 at the node N2 (i.e., the voltage at the mirror branch circuit 114).

In some embodiments, the bias generation circuit 130 may include a voltage regulating circuit 132, a transistor T5A, a resistor R1A, and a capacitor C1A. The voltage regulating circuit 132 has a first terminal and a second terminal. The first terminal of the voltage regulating circuit 132 may be coupled to the node N2, and the second terminal of the voltage regulating circuit 132 may be coupled to the base voltage terminal VSS. The voltage regulating circuit 132 may include a resistor R2A, and diodes D1A and D2A. The resistor R2A has a first terminal and a second terminal. The first terminal of the resistor R2A may be coupled to the first terminal of the voltage regulating circuit 132. The diode D1A has a first terminal and a second terminal. The first terminal of the diode D1A may be coupled to the second terminal of the resistor R2A. The diode D2A has a first terminal and a second terminal. The first terminal of the diode D2A may be coupled to the second terminal of the diode D1A, and the second terminal of the diode D2A may be coupled to the second terminal of the voltage regulating circuit 132. The transistor T5A has a first terminal, a second terminal, and a control terminal. The first terminal of the transistor T5A may be coupled to an operation voltage terminal VDD2, and the control terminal of the transistor T5A may be coupled to the second terminal of the resistor R2A. The resistor R1A has a first terminal and a second terminal. The first terminal of the resistor R1A may be coupled to the second terminal of the transistor T5A, and the second terminal of the resistor R1A may be coupled to the bias terminal NB of the amplifier AMP and may output the bias signal Sbias. The capacitor C1A has a first terminal and a second terminal. The first terminal of the capacitor C1A may be coupled to the control terminal of the transistor T5A, and the second terminal of the capacitor C1A may be coupled to the base voltage terminal VSS.

In some embodiments, in order to accurately mirror the reference current Iref to generate a stable mirrored current Im1, the voltage difference between the control terminal and the first terminal of the transistor T1A and the voltage difference between the control terminal and the first terminal of the transistor T2A are required to be substantially equal, and the voltage difference between the second terminal and the first terminal of the transistor T1A and the voltage difference between the second terminal and the first terminal of the transistor T2A are also required to be substantially equal. Furthermore, the mirrored current Im1 flows through the voltage regulating circuit 132 to result in a voltage drop across the resistor R2A and turn on the diodes D1A and D2A. In such a case, the second voltage V2 (i.e., the voltage VN2) may be regarded as the sum of the voltage drop across the resistor R2A and the turn-on voltages of the diodes D1A and D2A. The transistor T1A and the operational amplifier 120 may form a negative feedback loop to result in a virtual short between the first input terminal and the second input terminal of the operational amplifier 120. That is, the control voltage Vctrl generated by the operational amplifier 120 may cause the first voltage V1 to track the second voltage V2, so that when the bias circuit 100 is operated in an operating mode, the first voltage V1 and the second voltage V2 may be substantially equal. In this manner, the voltage difference between the second terminal and the first terminal of the transistor T1A may be substantially equal to the voltage difference between the second terminal and the first terminal of the transistor T2A, so as to accurately mirror the reference current Iref to generate a stable mirrored current Im1, for the bias generation circuit 130 to generate a stable bias signal Sbias accordingly.

In some embodiments, the bias generation circuit 130 and the amplifier AMP may be disposed on the first die, and the current mirror circuit 110 and the operational amplifier 120 may be disposed on the second die.

In some embodiments, when the system is just powered on, the first voltage V1 and the second voltage V2 may be equal to the voltage at the base voltage terminal VSS (for example, 0V) or the voltage at the reference voltage terminal Vref (for example, 3V), resulting in an inoperative current mirror circuit 110. In order to resolve the problem of the first voltage V1 and the second voltage V2 being equal to the voltage at the base voltage terminal VSS, the bias circuit 100 may further include a startup circuit setting the second voltage V2 at a proper level upon startup of the bias circuit 100, so as to adjust the first voltage V1 accordingly.

Figure 2:
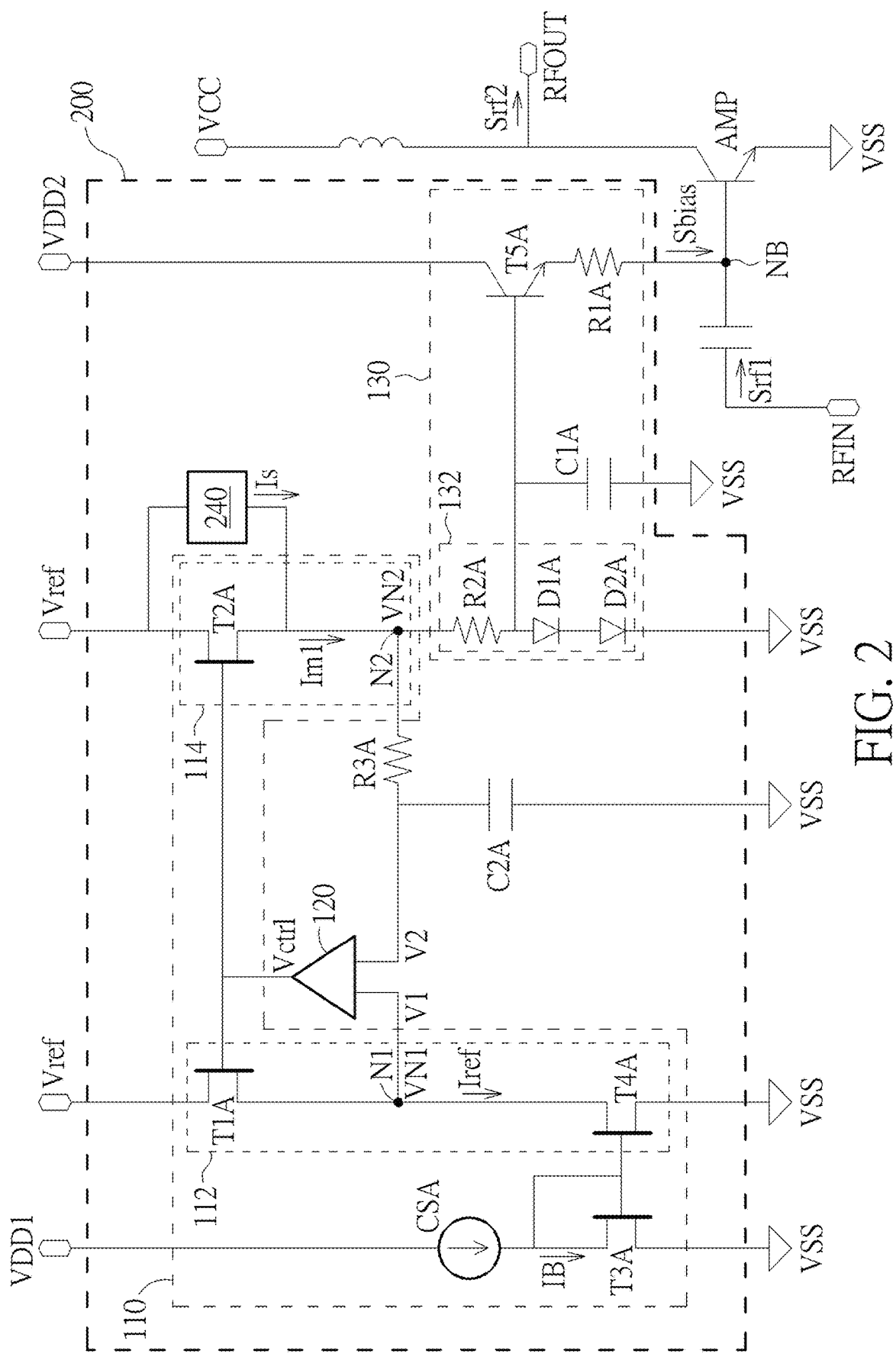
FIG. 2 is a schematic diagram of a bias circuit according to another embodiment of the invention.

FIG. 2 is a schematic diagram of a bias circuit 200 according to another embodiment of the invention. The bias circuits 200 and 100 are similar in structure and may operate according to similar principles. The bias circuit 200 may further include a startup circuit 240. The startup circuit 240 may be coupled to the reference voltage terminal Vref and the node N2, and may generate a startup current Is to set the voltage VN2 to a preset value when the bias circuit 200 is operating in a startup mode, and as a result, the second voltage V2 will be set to the preset value and have a proper operating level. That is, in the embodiment in FIG. 2, the second voltage V2 is an adjusted voltage of the voltage VN2 at the mirror branch circuit 114. In some embodiments, the startup current Is may include a pulse. In this manner, the operational amplifier 120 may correspondingly output the control voltage Vctrl to vary the first voltage V1 from an initial value to track the preset value of the second voltage V2, and when the bias circuit 200 enters the operating mode, the first voltage V1 and the second voltage V2 may be substantially equal. Therefore, the current mirror circuit 110 may operate properly to accurately mirror the reference current Iref to generate a stable mirrored current Im1, for the bias generation circuit 130 to generate a stable bias signal Sbias accordingly.

Moreover, since the startup circuit 240 may first raise the second voltage V2 to the preset value at the startup of the bias circuit 200, the time for the operational amplifier 120 to adjust the first voltage V1 may be reduced, and ensuring that the current mirror circuit 110 can operate in a stable state to provide a stable mirrored current Im1. In addition, the temperature of the amplifier AMP will increase with the operating time, resulting in a decrease in the gain. However, the startup current Is generated by the startup circuit 240 upon the startup of the bias circuit 200 may also be used to preheat the amplifier AMP, facilitating the amplifier AMP to maintain the gain within a predetermined range during subsequent operations.

Figure 3:
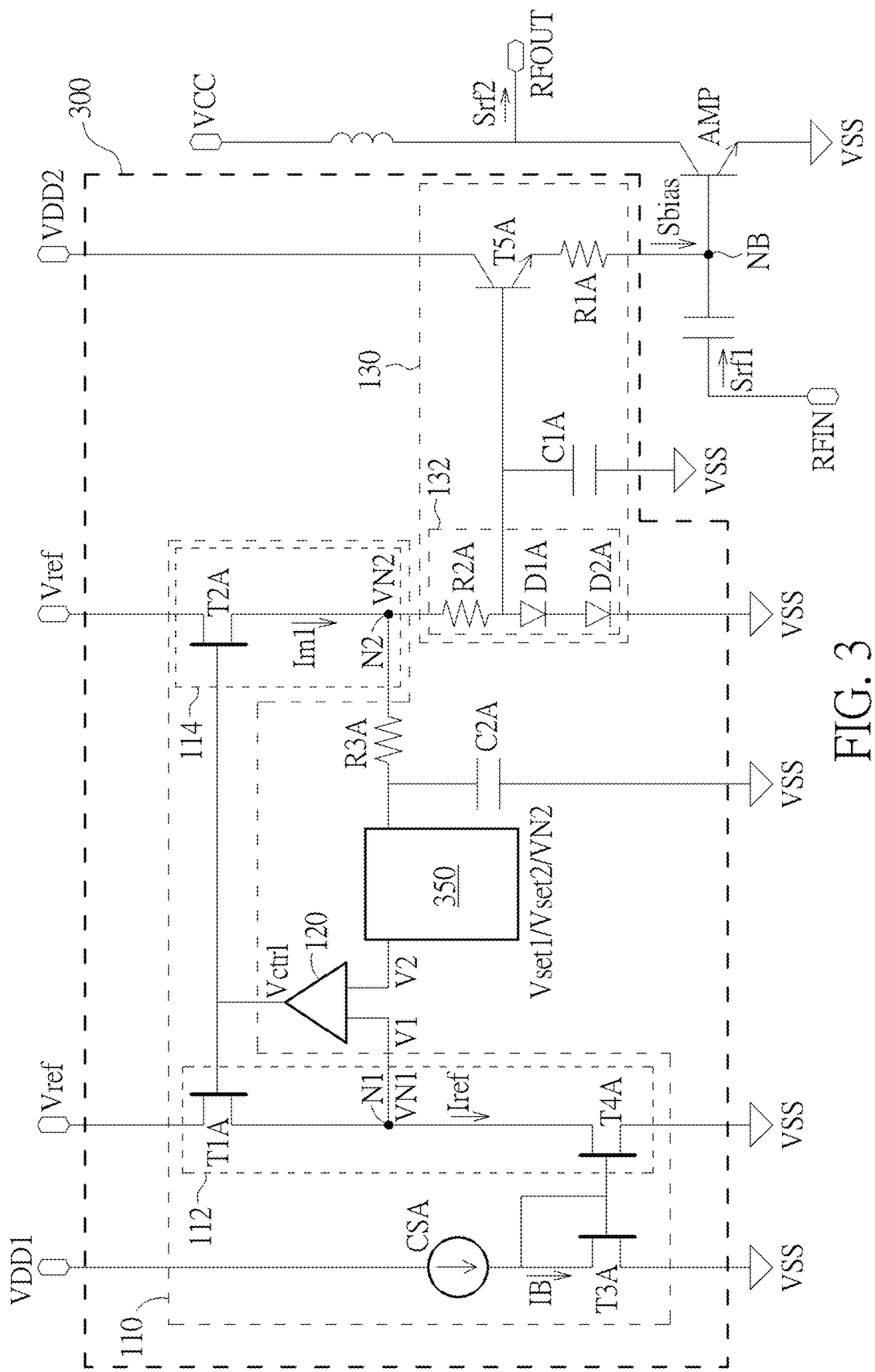
FIG. 3 is a schematic diagram of a bias circuit according to another embodiment of the invention.

FIG. 3 is a schematic diagram of a bias circuit 300 according to another embodiment of the invention. The bias circuits 300 and 100 are similar in structure and may operate according to similar principles. The bias circuit 300 may further include a voltage selection circuit 350. The voltage selection circuit 350 may be coupled to the second input terminal of the operational amplifier 120 and the node N2. The voltage selection circuit 350 may set the second voltage V2 according to the voltage VN2. For example, when the voltage VN2 is greater than an upper limit voltage, the voltage selection circuit 350 may set the second voltage V2 to be a first preset voltage Vset1 less than or equal to the upper limit voltage. In some embodiments, the upper limit voltage may be less than the voltage at the reference voltage terminal Vref, and the first preset voltage Vset1 may be, but is not limited to, 2.8V. Alternatively, when the voltage VN2 is less than the lower limit voltage, the voltage selection circuit 350 may set the second voltage V2 to be a second preset voltage Vset2 exceeding or equal to the lower limit voltage. In some embodiments, the second preset voltage Vset2 may be, but is not limited to, 2V. In some embodiments, the first preset voltage Vset1 and the second preset voltage Vset2 may be set to satisfy the operating voltage of the operational amplifier 120 and the operating voltage of the current mirror formed by the transistors T3A and T4A. Alternatively, when the voltage VN2 is between the upper limit voltage and the lower limit voltage, the voltage selection circuit 350 may set the second voltage V2 to be equal to the voltage VN2. That is, in the embodiment in FIG. 3, the second voltage V2 is an adjusted voltage of the voltage VN2 at the mirror branch circuit 114 or the voltage VN2 at the mirror branch circuit 114. In some embodiments, the second voltage V2 may be set to a level to enable the transistors T1A and T2A to operate in a saturation region.

Since the voltage selection circuit 350 may adjust the second voltage V2 according to the voltage VN2, the second voltage V2 may be set to an appropriate voltage level upon startup of the bias circuit 300, so that the operational amplifier 120 may adjust the first voltage V1 accordingly, resulting in the substantially equal first voltage V1 and second voltage V2 when the bias circuit 300 enters the operating mode. In this manner, the bias circuit 300 can resolve the problem in FIG. 1, in which the first voltage V1 and the second voltage V2 may be equal to the voltage at the base voltage terminal VSS or the voltage at the reference voltage terminal Vref, while reducing the time for the operational amplifier 120 to adjust the first voltage V1, and ensuring that the current mirror circuit 110 can operate in a stable state to provide a stable mirrored current Im1.

Figure 4:
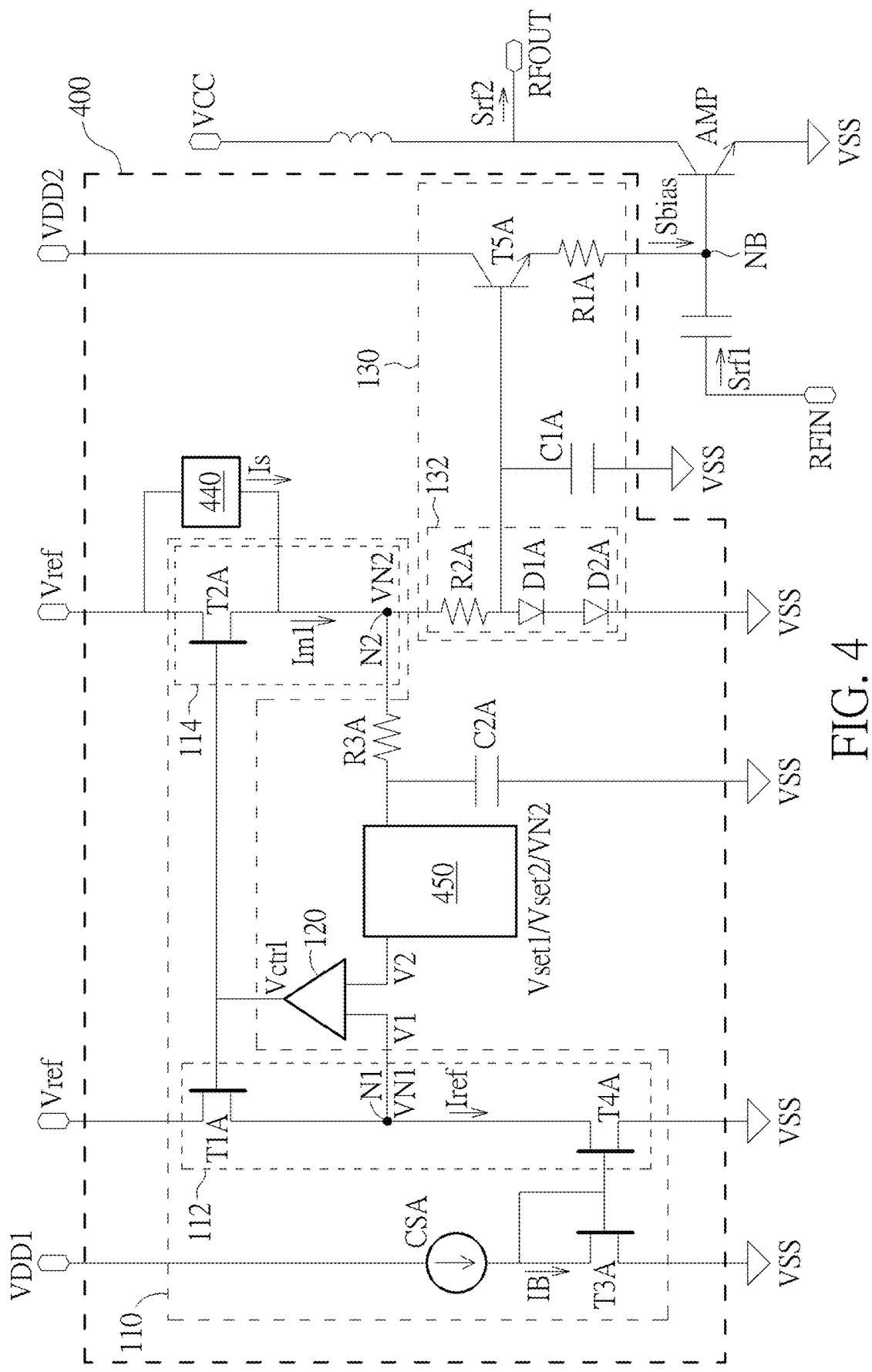
FIG. 4 is a schematic diagram of a bias circuit according to another embodiment of the invention.

FIG. 4 is a schematic diagram of a bias circuit 400 according to another embodiment of the invention. The bias circuit 400 and the bias circuits 200, 300 are similar in structure and may operate according to similar principles. The bias circuit 400 may further include a startup circuit 440 and a voltage selection circuit 450. For example, in the startup mode of the bias circuit 400, the voltage selection circuit 450 may set the second voltage V2 according to the voltage VN2, and the startup circuit 440 may preheat the amplifier AMP. In this manner, the bias circuit 400 can resolve the problem in FIG. 1, in which the first voltage V1 and the second voltage V2 may be equal to the voltage at the base voltage terminal VSS or the voltage at the reference voltage terminal Vref, while reducing the time for the operational amplifier 120 to adjust the first voltage V1, and ensuring that the current mirror circuit 110 can operate in a stable state to provide a stable mirrored current Im1. In addition, the bias circuit 400 may further facilitate to maintain the gain of the amplifier AMP within a predetermined range. That is, in the embodiment in FIG. 4, the second voltage V2 is an adjusted voltage of the voltage VN2 at the mirror branch circuit 114 or the voltage VN2 at the mirror branch circuit 114.

In some embodiments, when the amplifier AMP is in operation, the RF signal Srf1 may leak from the input terminal RFIN via the bias generation circuit 130 to the mirror branch circuit 114, affecting the stability of the voltage VN2, and further affecting the stability of the second voltage V2. However, in the bias circuits 100 to 400, the resistor R2A and the capacitor C1A in the bias generation circuit 130 may serve as a low-pass filter to filter out the undesired RF signal Srf1, so as to reduce the interference of the RF signal Srf1 to the voltage VN2, and maintain the stability of the second voltage V2. In addition, the bias circuits 100 to 400 may further include a resistor R3A and a capacitor C2A. The resistor R3A has a first terminal and a second terminal. The first terminal of the resistor R3A may be coupled to the second input terminal of the operational amplifier 120, and the second terminal of the resistor R3A may be coupled to the node N2. The capacitor C2A has a first terminal and a second terminal. The first terminal of the capacitor C2A may be coupled to the first terminal of the resistor R3A, and the second terminal of the capacitor C2A may be coupled to the base voltage terminal VSS. The resistor R3A and the capacitor C2A may serve as a low-pass filter to filter out the undesired RF signal Srf1, so as to reduce the interference of the RF signal Srf1 to the second voltage V2. In some embodiments, in order to improve the stability of the second voltage V2, another mirror branch circuit may be introduced to the current mirror circuit 110.

Figure 5:
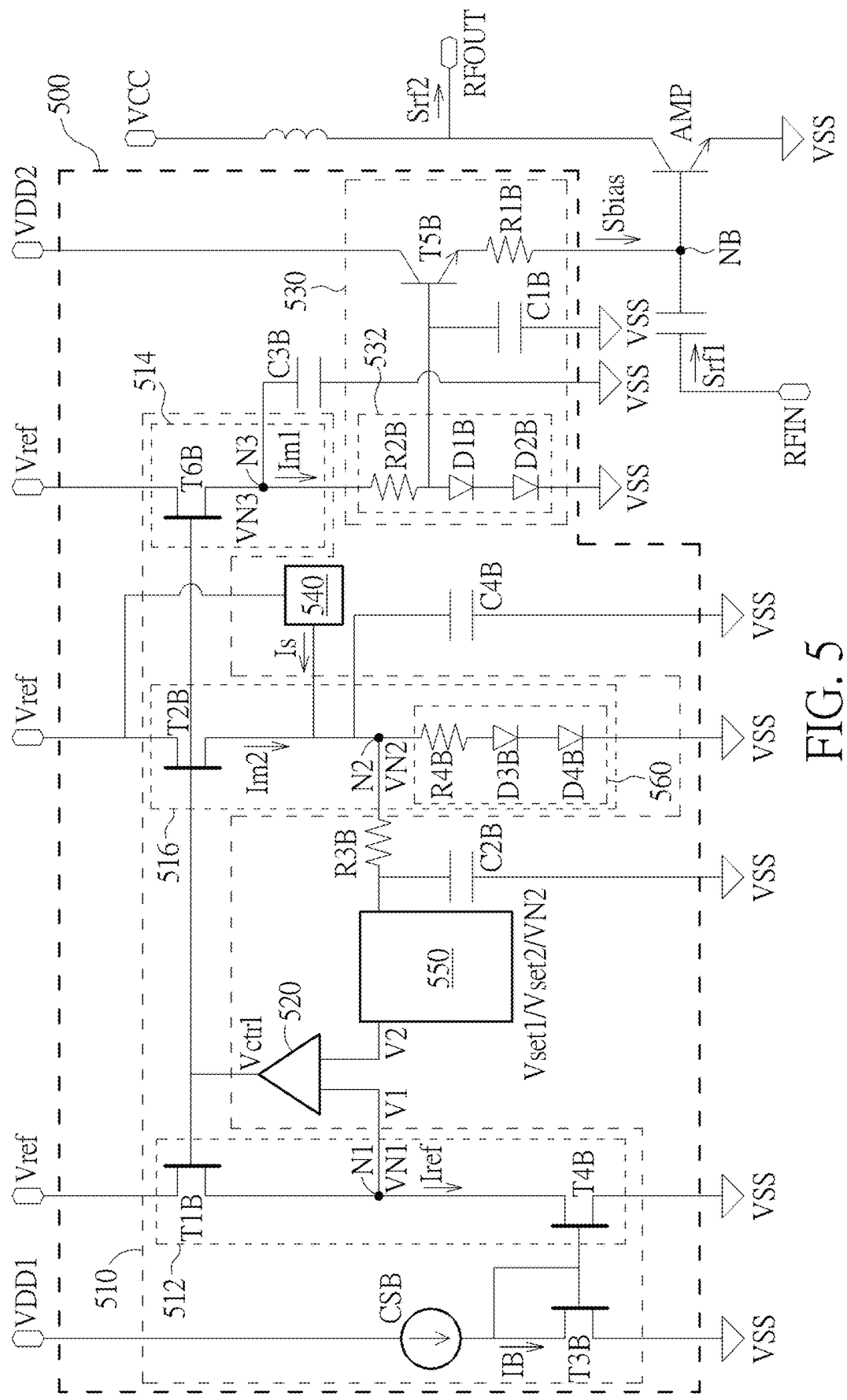
FIG. 5 is a schematic diagram of a bias circuit according to another embodiment of the invention.

FIG. 5 is a schematic diagram of a bias circuit 500 according to another embodiment of the invention. The bias circuits 500 and 400 are similar in structure and may operate according to similar principles. The current mirror circuit 510 of the bias circuit 500 may include a reference branch circuit 512, a mirror branch circuit 514, and a mirror branch circuit 516. The mirror branch circuit 514 may generate the mirrored current Im1 according to the reference current Iref, and the mirror branch circuit 516 may generate the mirrored current Im2 according to the reference current Iref. In such a case, the bias generation circuit 530 may generate the bias signal Sbias according to the mirrored current Im1.

In FIG. 5, the current mirror circuit 510 may further include a current source CSB and a transistor T3B, and the reference branch circuit 512 may include a node N1, and transistors T1B and T4B. The current source CSB may be coupled to an operation voltage terminal VDD1 to generate the base current IB. The transistor T3B has a first terminal, a second terminal, and a control terminal. The first terminal of the transistor T3B may be coupled to the current source CSB to receive the base current IB, the second terminal of the transistor T3B may be coupled to a base voltage terminal VSS, and the control terminal of the transistor T3B may be coupled to the first terminal of the transistor T3B. The node N1 may be set between the transistors T1B and T4B. The transistor T1B has a first terminal, a second terminal, and a control terminal. The first terminal of the transistor T1B may be coupled to a reference voltage terminal Vref, and the second terminal of the transistor T1B may be coupled to the node N1. The transistor T4B has a first terminal, a second terminal, and a control terminal. The first terminal of the transistor T4B may be coupled to the node N1, the second terminal of the transistor T4B may be coupled to the base voltage terminal VSS, and the control terminal of the transistor T4B may be coupled to the control terminal of the transistor T3B. In other words, the transistors T3B and T4B may form a current mirror mirroring the base current IB to generate the reference current Iref.

The mirror branch circuit 516 may include a node N2, a transistor T2B, and a voltage regulating circuit 560. The node N2 may be set between the transistor T2B and the voltage regulating circuit 560. The transistor T2B has a first terminal, a second terminal, and a control terminal. The first terminal of the transistor T2B may be coupled to the reference voltage terminal Vref, the second terminal of the transistor T2B may be coupled to the node N2, and the control terminal of the transistor T2B may be coupled to the control terminal of the transistor T1B. The voltage regulating circuit 560 has a first terminal and a second terminal. The first terminal of the voltage regulating circuit 560 may be coupled to the node N2, and the second terminal of the voltage regulating circuit 560 may be coupled to the base voltage terminal VSS. The voltage regulating circuit 560 may include a resistor R4B, a diode D3B and a diode D4B.

The resistor R4B has a first terminal and a second terminal. The first terminal of the resistor R4B may be coupled to the first terminal of the voltage regulating circuit 560. The diode D3B has a first terminal and a second terminal. The first terminal of the diode D3B may be coupled to the second terminal of the resistor R4B. The diode D4B has a first terminal and a second terminal. The first terminal of the diode D4B may be coupled to the second terminal of the diode D3B, and the second terminal of the diode D4B may be coupled to the second terminal of the voltage regulating circuit 560.

The operational amplifier 520 has a first input terminal, a second input terminal, and an output terminal. The first input terminal of the operational amplifier 520 may be coupled to the node N1, the second input terminal of the operational amplifier 520 may be coupled to the node N2, and the output terminal of the operational amplifier 520 may be coupled to the control terminal of the transistor T1B and the control terminal of the transistor T2B.

The mirror branch circuit 514 may include a node N3 and a transistor T6B. The node N3 may be set between the transistor T6B and the bias generation circuit 530. The transistor T6B has a first terminal, a second terminal, and a control terminal. The first terminal of the transistor T6B may be coupled to the reference voltage terminal Vref, the second terminal of the transistor T6B may be coupled to the node N3, and the control terminal of the transistor T6B may be coupled to the control terminal of the transistor T2B. In this manner, the voltage difference between the control terminal and the first terminal of the transistor T1B, the voltage difference between the control terminal and the first terminal of the transistor T2B, and the voltage difference between the control terminal and the first terminal of the transistor T6B may be substantially equal, and the transistors T1B, T2B and T6B may form a current mirror mirroring the reference current Iref to generate the mirrored currents Im2 and Im1, respectively.

In addition, the bias generation circuit 530 may include a voltage regulating circuit 532, a transistor TSB, a resistor R1B, and a capacitor C1B. The voltage regulating circuit 532 has a first terminal and a second terminal. The first terminal of the voltage regulating circuit 532 may be coupled to the node N3, and the second terminal of the voltage regulating circuit 532 may be coupled to the base voltage terminal VSS. In FIG. 5, the voltage regulating circuit 532 and the voltage regulating circuit 560 may be similar in structure. For example, the voltage regulating circuit 532 may include a resistor R2B, a diode D1B, and a diode D2B. The resistor R2B has a first terminal and a second terminal. The first terminal of the resistor R2B may be coupled to the first terminal of the voltage regulating circuit 532. The diode D1B has a first terminal and a second terminal. The first terminal of the diode D1B may be coupled to the second terminal of the resistor R2B. The diode D2B has a first terminal and a second terminal. The first terminal of the diode D2B may be coupled to the second terminal of the diode D1B, and the second terminal of the diode D2B may be coupled to the second terminal of the voltage regulating circuit 532. The transistor T5B has a first terminal, a second terminal, and a control terminal. The first terminal of the transistor T5B may be coupled to an operation voltage terminal VDD2, and the control terminal of the transistor T5B may be coupled to the second terminal of the resistor R2B. The resistor R1B has a first terminal and a second terminal. The first terminal of the resistor R1B may be coupled to the second terminal of the transistor TSB, and the second terminal of the resistor R1B may be coupled to the bias terminal NB of the amplifier AMP and may output the bias signal Sbias. The capacitor C1B has a first terminal and a second terminal. The first terminal of the capacitor C1B may be coupled to the control terminal of the transistor TSB, and the second terminal of the capacitor C1B may be coupled to the base voltage terminal VSS. In some embodiments, the mirrored current Im1 flows through the voltage regulating circuit 532 to result in a voltage drop across the resistor R2B and turn on the diodes D1B and D2B. In such a case, a voltage VN3 at the node N3 may be regarded as the sum of the voltage drop of the resistor R2B and the turn-on voltages of the diodes D1B and D2B.

In some embodiments, in order to accurately mirror the reference current Iref to respectively generate stable mirrored currents Im2 and Im1, the voltage difference between the control terminal and the first terminal of the transistor T1B, the voltage difference between the control terminal and the first terminal of the transistor T2B and the voltage difference between the control terminal and the first terminal of the transistor T6B are required to be substantially equal, and the voltage difference between the second terminal and the first terminal of the transistor T1B, the voltage difference between the second terminal and the first terminal of the transistor T2B, and the voltage difference between the second terminal and the first terminal of the transistor T6B are also required to be substantially equal. Furthermore, the mirrored current Im2 flows through the voltage regulating circuit 560 to result in a voltage drop across the resistor R4B and turn on the diodes D3B and D4B. In such a case, the voltage VN2 at the node N2 may be regarded as the sum of the voltage drop of the resistor R4B and the turn-on voltages of the diodes D3B and D4B. The transistor T1B and the operational amplifier 520 may form a negative feedback loop to result in a virtual short between the first input terminal and the second input terminal of the operational amplifier 520. In FIG. 5, when the voltage VN1 at the node N1 (i.e., the voltage at the reference branch circuit 512) serves as the first voltage V1, and the voltage VN2 (i.e., the voltage at the mirror branch circuit 516) serves as the second voltage V2, the control voltage Vctrl generated by the operational amplifier 520 may cause the first voltage V1 to track the second voltage V2, so that when the bias circuit 500 is operated in the operating mode, the first voltage V1 and the second voltage V2 may be substantially equal. In some embodiments, the transistor T6B and the transistor T2B may have identical electrical characteristics, and the voltage regulating circuit 532 may also have identical electrical characteristics as the voltage regulating circuit 560, so the voltages VN3 and VN2 may be substantially equal. In this manner, the voltage difference between the second terminal and the first terminal of the transistor T1B, the voltage difference between the second terminal and the first terminal of the transistor T2B, and the voltage difference between the second terminal and the first terminal of the transistor T6B may be substantially equal, so as to accurately mirror the reference current Iref to respectively generate stable mirrored current Im2 and Im1, for the bias generation circuit 530 to output a stable bias signal Sbias accordingly.

Since the bias generation circuit 530 is coupled to the mirror branch circuit 514, and the second voltage V2 is related to the voltage at the mirror branch circuit 516, the RF signal Srf1 leaked from the input terminal RFIN via the bias generation circuit 530 will not or only slightly affect the stability of the second voltage V2.

In some embodiments, the bias circuit 500 may further include a capacitor C3B and a capacitor C4B. The capacitor C3B has a first terminal and a second terminal. The first terminal of the capacitor C3B may be coupled to the node N3, and the second terminal of the capacitor C3B may be coupled to the base voltage terminal VSS. In FIG. 5, the resistor R2B and the capacitor C1B in the bias generation circuit 530 may form a low-pass filter, and the resistor R2B and the capacitor C3B may form another low-pass filter to filter out the undesirable RF signal Srf1, so as to reduce the interference of the RF signal Srf1 to the voltage VN3, and maintain the stability of the voltage VN3. The capacitor C4B has a first terminal and a second terminal. The first terminal of the capacitor C4B may be coupled to the node N2, and the second terminal of the capacitor C4B may be coupled to the base voltage terminal VSS. The resistor R4B in the voltage regulating circuit 560 and the capacitor C4B may serve as a low-pass filter to filter out the undesired RF signal Srf1, so as to reduce the interference of the RF signal Srf1 to the voltage VN2, and maintain the stability of the second voltage V2. Furthermore, the bias circuit 500 may further include a startup circuit 540, a voltage selection circuit 550, a resistor R3B and a capacitor C2B. The circuit connection and operation principle of the startup circuit 540, the voltage selection circuit 550, the resistor R3B and the capacitor C2B are similar to those described above, and explanation therefor will not be repeated here. In some embodiments, the startup circuit 540 and/or the voltage selection circuit 550 may be selectively provided according to different applications or system requirements. When the bias circuit 500 includes the startup circuit 540 and/or the voltage selection circuit 550, the second voltage V2 may be an adjusted voltage of the voltage VN2 at the mirror branch circuit 516 or the voltage VN2 at the mirror branch circuit 516.

In some embodiments, the transistors T3A, T4A, T3B, and T4B may be N-type metal oxide semiconductor transistors (NMOS). Therefore, the first terminals of the transistors T3A, T4A, T3B, and T4B may be drains, the second terminals of the transistors T3A, T4A, T3B, and T4B may be sources, and the control terminals of the transistors T3A, T4A, T3B, and T4B may be gates. The transistors T1A, T2A, T1B, T2B and T6B may be P-type metal oxide semiconductor transistors (PMOS). Therefore, the first terminals of the transistors T1A, T2A, T1B, T2B and T6B may be sources, the second terminals of the transistors T1A, T2A, T1B, T2B and T6B may be drains, and the control terminals of the transistors T1A, T2A, T1B, T2B and T6B may be gates. The transistors T5A and TSB may be bipolar junction transistors (BJT). Therefore, the first terminals of the transistors T5A and TSB may be collectors, the second terminals of the transistors T5A and TSB may be emitters, and the control terminals of the transistors T5A and TSB may be bases.

In some embodiments, since the RF signal is relatively weak, a single-stage amplifier may be unable to amplify the RF signal to a sufficiently high level. In such a case, a multi-stage amplifier is used to amplify the RF signal. Nevertheless, the RF signals may leak to the bias circuit of the final stage amplifier, and when the multi-stage amplifier are coupled to the same reference voltage terminal, the RF signals may be further leak via the reference voltage terminal to other amplifier stages, affecting the linearity of every amplifier stage.

Figure 6:
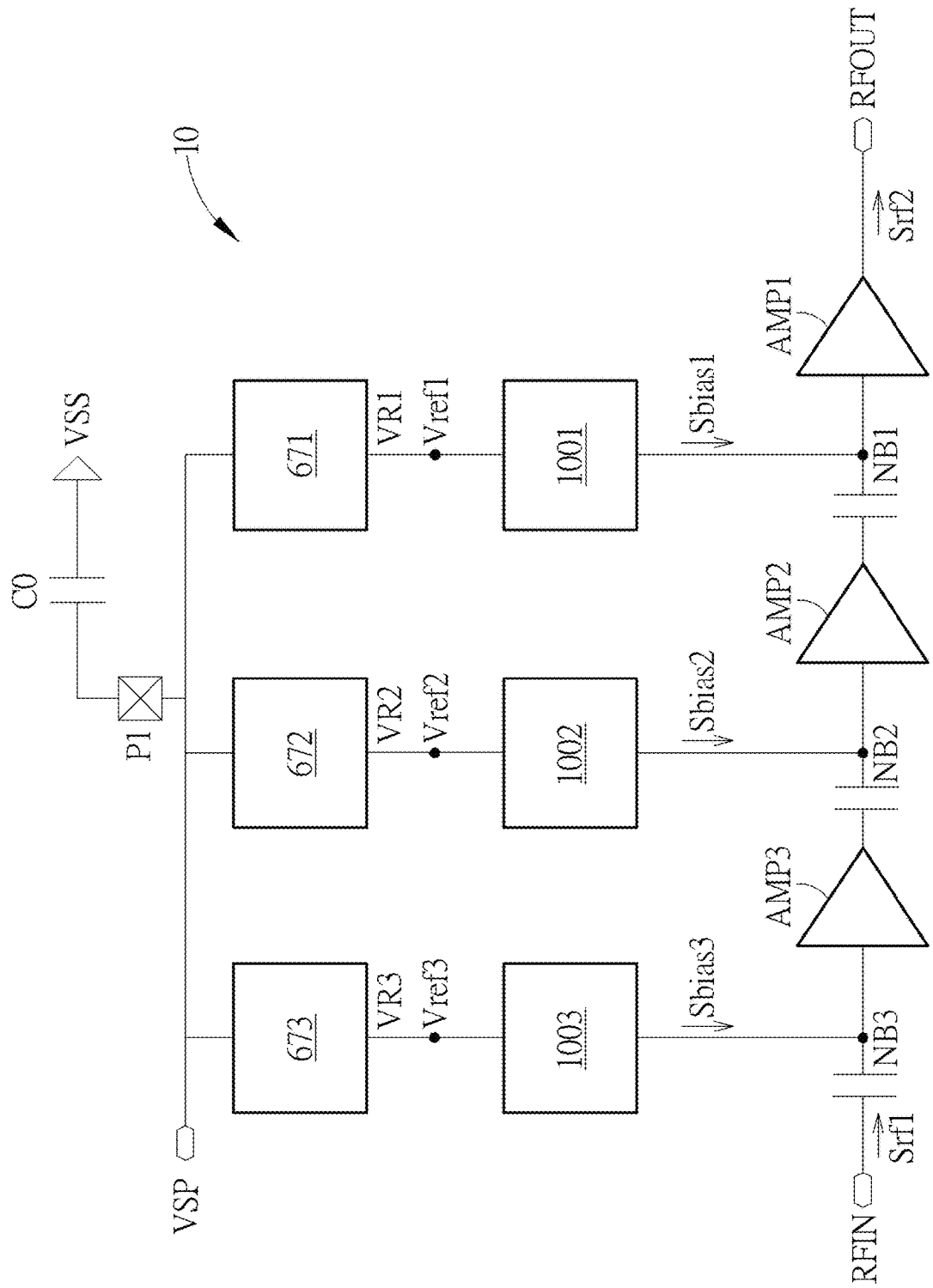
FIG. 6 is a schematic diagram of an amplifier device according to an embodiment of the invention.

FIG. 6 is a schematic diagram of an amplifier device 10 according to an embodiment of the invention. The amplifier device 10 may include bias circuits 1001 and 1002, an input terminal RFIN, an output terminal RFOUT, and amplifiers AMP1 and AMP2. In some embodiments, the bias circuits 1001 and 1002 may have the same structure as the bias circuit 100, 200, 300, 400, or 500, and may operate according to the same principle. The input terminal RFIN may receive the RF signal Srf1, and the output terminal RFOUT may output the amplified RF signal Srf2. The amplifier AMP1 may receive the bias signal Sbias1 generated by the bias circuit 1001, and the amplifier AMP2 may receive the bias signal Sbias2 generated by the bias circuit 1002. In FIG. 6, the amplifiers AMP1 and AMP2 may be coupled between the input terminal RFIN and the output terminal RFOUT of the amplifier device 10. Furthermore, the amplifier AMP2 may be coupled between the input terminal RFIN of the amplifier device 10 and the amplifier AMP1. In other words, the amplifier device 10 may include a two-stage amplifier. The two-stage amplifier may include amplifiers AMP1 and AMP2 for use to amplify the RF signal Srf1 successively.

In addition, the bias circuit 1001 may be coupled between the reference voltage terminal Vref1 and a bias terminal NB1 of the amplifier AMP1 to receive the reference voltage VR1. The bias circuit 1002 may be coupled between the reference voltage terminal Vref2 and a bias terminal NB2 of the amplifier AMP2 to receive the reference voltage VR2. The amplifier device 10 may further include a low-dropout (LDO) regulator 671 and a LDO regulator 672. The LDO regulator 671 may generate the reference voltage VR1 at the reference voltage terminal Vref1 according to the supply voltage at the supply voltage terminal VSP, and the LDO regulator 672 may generate the reference voltage VR2 at the reference voltage terminal Vref2 according to the supply voltage at the supply voltage terminal VSP. In some embodiments, in order to maintain the linearity of the amplifiers AMP1 and AMP2, the undesired RF signal Srf1 may be filtered out by adopting a capacitor C0. Furthermore, the supply voltage terminal VSP may be further coupled to an external pin P1 of the amplifier device 10, and the capacitor C0 may be coupled to the external pin P1, that is, the capacitor C0 is provided externally to the amplifier device 10. In this manner, the capacitor C0 having a larger capacitance may be selected to effectively filter out the undesired RF signal Srf1 without increasing the area of the amplifier device 10, while providing a flexible design for the amplifier device 10.

In some embodiments, the amplifier device 10 may further include an amplifier AMP3, a bias circuit 1003, and a LDO regulator 673. In other words, the amplifier device 10 may include more amplifiers, such as a three-stage amplifier. The three-stage amplifier may include amplifiers AMP1 to AMP3 for use to successively amplify the RF signal Srf1. The amplifier AMP3 may be arranged between the input terminal RFIN of the amplifier device 10 and the amplifier AMP2, and may receive the bias signal Sbias3 generated by the bias circuit 1003. The bias circuit 1003 may be coupled between the reference voltage terminal Vref3 and a bias terminal NB3 of the amplifier AMP3 to receive a reference voltage VR3. The LDO regulator 673 may generate the reference voltage VR3 at the reference voltage terminal Vref3 according to the supply voltage at the supply voltage terminal VSP. The present invention is not limited by the number of LDO regulators given in the amplifier device 10. In some embodiments, the amplifier device 10 may include a smaller number of LDO regulators according to system requirements, and the LDO regulator 672 or 673 may be omitted.

Figure 7:
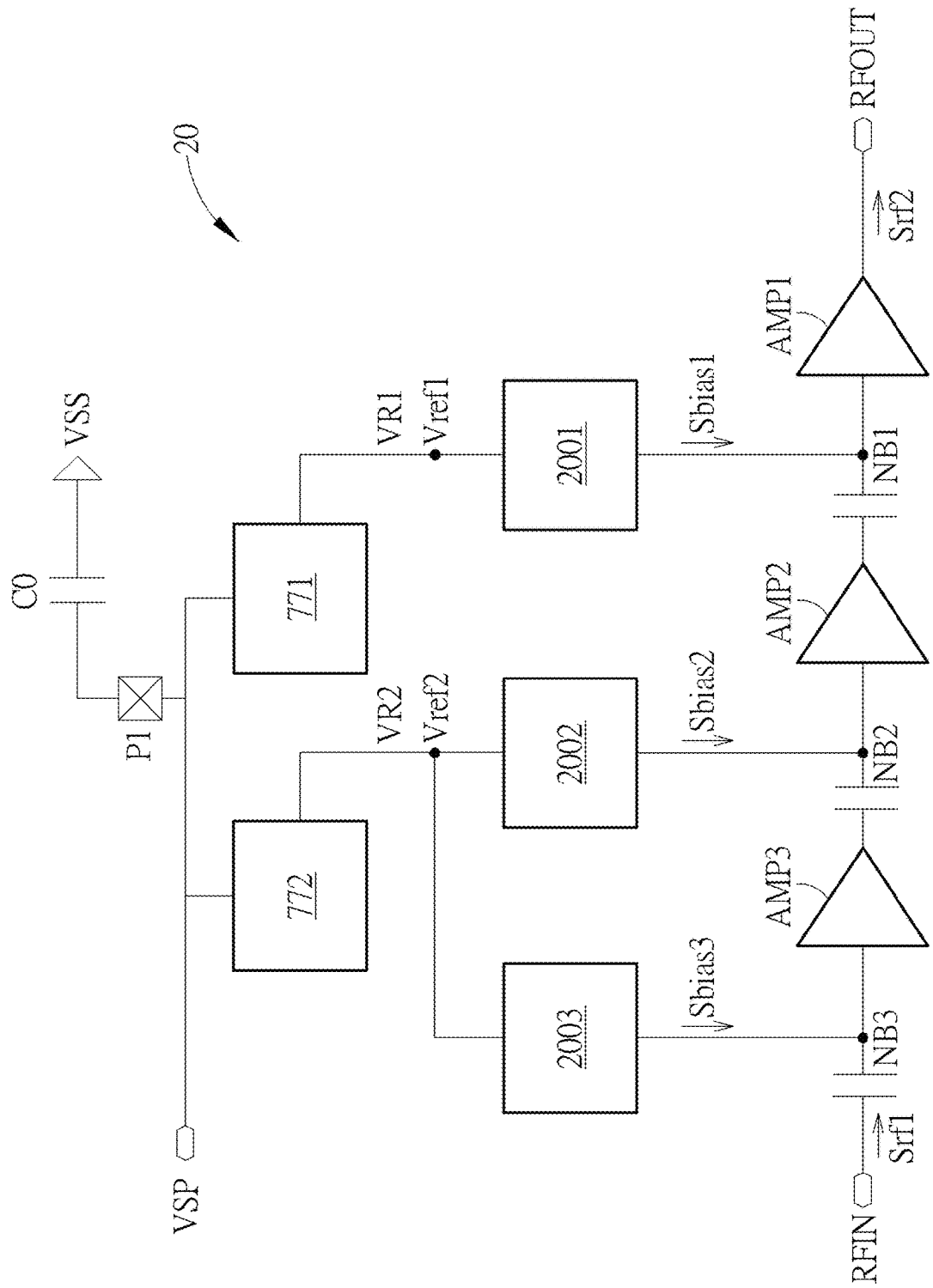
FIG. 7 is a schematic diagram of an amplifier device according to another embodiment of the invention.

FIG. 7 is a schematic diagram of an amplifier device 20 according to another embodiment of the invention. The amplifier device 20 may include bias circuits 2001, 2002, and 2003, an input terminal RFIN, an output terminal RFOUT, amplifiers AMP1 to AMP3, and LDO regulators 771 and 772. The amplifier devices 20 and 10 are similar in structure and operating principle. The main difference lies in the bias circuit 2003 and the LDO regulators 771 and 772 in the amplifier device 20.

In FIG. 7, the bias circuit 2001 may be coupled between the reference voltage terminal Vref1 and the bias terminal NB1 of the amplifier AMP1 to receive the reference voltage VR1. The bias circuit 2002 may be coupled between the reference voltage terminal Vref2 and the bias terminal NB2 of the amplifier AMP2 to receive the reference voltage VR2. The bias circuit 2003 may be coupled between the reference voltage terminal Vref2 and the bias terminal NB3 of the amplifier AMP3 to receive the reference voltage VR2. The LDO regulator 771 may generate the reference voltage VR1 at the reference voltage terminal Vref1 according to the supply voltage at the supply voltage terminal VSP, and the LDO regulator 772 may generate the reference voltage VR2 at the reference voltage terminal Vref2 according to the supply voltage at the supply voltage terminal VSP. In other words, the bias circuit 2003 and the bias circuit 2002 may share a common LDO regulators.

In some embodiments, in order to maintain the linearity of the amplifiers AMP1 to AMP3, the undesired RF signal Srf1 may be filtered out by setting a capacitor C0. Furthermore, the supply voltage terminal VSP may be further coupled to an external pin P1 of the amplifier device 20, and the capacitor C0 may be coupled to the external pin P1, that is, the capacitor C0 is provided externally to the amplifier device 20. In this manner, the capacitor C0 having a larger capacitance may be selected to effectively filter out the undesired RF signal Srf1 without increasing the area of the amplifier device 20, providing a flexible design for the amplifier device 20.

In the embodiments of the present invention, the bias circuits and amplifier devices may be designed so that the transistors of different branch circuits in the internal current mirror circuit may meet the required operating voltage conditions, thereby providing a stable mirrored current to enable the bias generation circuit to generate a stable bias signal, and maintaining the performance of the amplifier. In addition, when the amplifier device includes a multi-stage amplifier, an external capacitor may also be adopted to reduce the impact of undesired RF signals on each amplifier stage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A bias circuit comprising:
  a current mirror circuit comprising:
    a reference branch circuit configured to generate a reference current according to a base current, the reference branch circuit comprising:
      a first transistor having a first terminal coupled to a first reference voltage terminal, a second terminal coupled to a first node, and a control terminal; and
    at least one mirror branch circuit configured to generate at least one mirrored current according to the reference current, the at least one mirror branch circuit comprising a first mirror branch circuit configured to generate a first mirrored current of the at least one mirrored current, and the first mirror branch circuit comprising:

a second transistor having a first terminal coupled to the first reference voltage terminal, a second terminal coupled to a second node, and a control terminal coupled to the control terminal of the first transistor;
an operational amplifier coupled to the reference branch circuit and the at least one mirror branch circuit, and configured to receive a first voltage and a second voltage, and generate a control voltage according to the second voltage, the control voltage being used to adjust the first voltage; and
a bias generation circuit coupled to the at least one mirror branch circuit and configured to generate a bias signal according to the first mirrored current;
wherein the first voltage is a voltage at the reference branch circuit, and the second voltage is a voltage at the at least one mirror branch circuit or an adjusted voltage thereof.

2. The bias circuit of claim 1, wherein:
the bias generation circuit comprises a first voltage regulating circuit having a first terminal coupled to the second node, and a second terminal coupled to a base voltage terminal, the first voltage regulating circuit further comprising:
a first resistor having a first terminal coupled to the first terminal of the first voltage regulating circuit, and a second terminal;
a first diode having a first terminal coupled to the second terminal of the first resistor, and a second terminal; and
a second diode having a first terminal coupled to the second terminal of the first diode, and a second terminal coupled to the second terminal of the first voltage regulating circuit.

3. The bias circuit of claim 2, wherein the second voltage is a sum of a voltage drop across the first resistor and turn-on voltages of the first diode and the second diode.

4. The bias circuit of claim 1, wherein the operational amplifier has a first input terminal coupled to the first node, a second input terminal coupled to the second node, and an output terminal coupled to the control terminal of the first transistor and the control terminal of the second transistor.

5. The bias circuit of claim 4, wherein a voltage difference between the control terminal and the first terminal of the first transistor is substantially equal to a voltage difference between the control terminal and the first terminal of the second transistor, and a voltage difference between the second terminal and the first terminal of the first transistor is substantially equal to a voltage difference between the second terminal and the first terminal of the second transistor.

6. The bias circuit of claim 4, wherein when the bias circuit is operated in an operating mode, the first voltage and the second voltage are substantially equal.

7. The bias circuit of claim 4, further comprising a first startup circuit configured to generate a first startup current to set the second voltage to a preset value when the bias circuit is operated in a startup mode, wherein the first voltage tracks from an initial value to the preset value of the second voltage.

8. The bias circuit of claim 4, further comprising a voltage selection circuit configured to set the second voltage according to a voltage at the second node.

9. The bias circuit of claim 8, wherein when the voltage at the second node is greater than an upper limit voltage, the voltage selection circuit sets the second voltage to be a first preset voltage less than or equal to the upper limit voltage.

10. The bias circuit of claim 8, wherein when the voltage at the second node is less than a lower limit voltage, the voltage selection circuit sets the second voltage to be a second preset voltage exceeding or equal to the lower limit voltage.

11. The bias circuit of claim 8, wherein when the voltage at the second node is between an upper limit voltage and a lower limit voltage, the voltage selection circuit sets the second voltage to be equal to the voltage at the second node.

12. A bias circuit comprising:
a current mirror circuit comprising:
a reference branch circuit configured to generate a reference current according to a base current; and
at least one mirror branch circuit configured to generate at least one mirrored current according to the reference current, the at least one mirror branch circuit comprising a first mirror branch circuit configured to generate a first mirrored current of the at least one mirrored current and a second mirror branch circuit configured to generate a second mirrored current of the at least one mirrored current;
an operational amplifier coupled to the reference branch circuit and the at least one mirror branch circuit, and configured to receive a first voltage and a second voltage, and generate a control voltage according to the second voltage, the control voltage being used to adjust the first voltage; and
a bias generation circuit coupled to the at least one mirror branch circuit and configured to generate a bias signal according to the first mirrored current;
wherein the first voltage is a voltage at the reference branch circuit, and the second voltage is a voltage at the at least one mirror branch circuit or an adjusted voltage thereof.

13. The bias circuit of claim 12, wherein:
the reference branch circuit comprises a third transistor having a first terminal coupled to a second reference voltage terminal, a second terminal coupled to a third node, and a control terminal;
the second mirror branch circuit comprises:
a fourth transistor having a first terminal coupled to the second reference voltage terminal, a second terminal coupled to a fourth node, and a control terminal coupled to the control terminal of the third transistor; and
a second voltage regulating circuit having a first terminal coupled to the fourth node, and a second terminal coupled to a base voltage terminal.

14. The bias circuit of claim 13, wherein:
the first mirror branch circuit comprises a fifth transistor having a first terminal coupled to the second reference voltage terminal, a second terminal coupled to a fifth node, and a control terminal coupled to the control terminal of the fourth transistor; and
the bias generation circuit comprises a third voltage regulating circuit having a first terminal coupled to the fifth node, and a second terminal coupled to the base voltage terminal.

15. The bias circuit of claim 14, wherein electrical characteristics of the fifth transistor are identical to those of the fourth transistor, and electrical characteristics of the third voltage regulating circuit are identical to those of the second voltage regulating circuit.

16. The bias circuit of claim 13, wherein the operational amplifier has a first input terminal coupled to the third node, a second input terminal coupled to the fourth node, and an output terminal coupled to the control terminal of the third transistor and the control terminal of the fourth transistor.

17. An amplifier device comprising:
- a first bias circuit comprising:
  - a first current mirror circuit configured to receive a first reference voltage, and comprising a first reference branch circuit and at least one first mirror branch circuit, the first reference branch circuit being configured to generate a first reference current according to a first base current, and the at least one first mirror branch circuit being configured to generate at least one first mirrored current according to the first reference current;
  - a first operational amplifier coupled to the first reference branch circuit and the at least one first mirror branch circuit, and configured to receive a first voltage and a second voltage, and generate a first control voltage according to the second voltage, wherein the first control voltage is used to adjust the first voltage, the first voltage is a voltage at the first reference branch circuit, and the second voltage is a voltage at the at least one first mirror branch circuit or an adjusted voltage thereof; and
  - a first bias generation circuit coupled to the at least one first mirror branch circuit and configured to generate a first bias signal according to the at least one first mirrored current;
- an input terminal configured to receive a radio frequency signal;
- an output terminal configured to output an amplified radio frequency signal; and
- a first amplifier coupled between the input terminal of the amplifier device and the output terminal of the amplifier device, and configured to receive the first bias signal and amplify the radio frequency signal;
- wherein the amplifier device further comprises:
- a second bias circuit comprising:
  - a second current mirror circuit configured to receive the first reference voltage, and comprising a second reference branch circuit and at least one second mirror branch circuit, the second reference branch circuit being configured to generate a second reference current according to a second base current, and the at least one second mirror branch circuit being configured to generate at least one second mirrored current according to the second reference current;
  - a second operational amplifier coupled to the second reference branch circuit and the at least one second mirror branch circuit, and configured to receive a third voltage and a fourth voltage, and generate a second control voltage according to the fourth voltage, wherein the second control voltage is used to adjust the third voltage, wherein the third voltage is a voltage at the second reference branch circuit, and the fourth voltage is a voltage at the at least one second mirror branch circuit or an adjusted voltage thereof; and
  - a second bias generation circuit coupled to the at least one second mirror branch circuit and configured to generate a second bias signal according to the at least one second mirrored current; and
- a second amplifier coupled between the input terminal of the amplifier device and the first amplifier, and configured to receive the second bias signal and amplify the radio frequency signal; or
- wherein the amplifier device further comprises:
- a third bias circuit comprising:
  - a third current mirror circuit configured to receive a second reference voltage, and comprising a third reference branch circuit and at least one third mirror branch circuit, the third reference branch circuit being configured to generate a third reference current according to a third base current, and the at least one third mirror branch circuit being configured to generate at least one third mirrored current according to the third reference current;
  - a third operational amplifier coupled to the third reference branch circuit and the at least one third mirror branch circuit, and configured to receive a fifth voltage and a sixth voltage, and generate a third control voltage according to the sixth voltage, wherein the third control voltage is used to adjust the fifth voltage, wherein the fifth voltage is a voltage at the third reference branch circuit, and the sixth voltage is a voltage at the at least one third mirror branch circuit or an adjusted voltage thereof; and
  - a third bias generation circuit coupled to the at least one third mirror branch circuit and configured to generate a third bias signal according to the at least one third mirrored current;
- a third amplifier coupled between the input terminal of the amplifier device and the first amplifier, and configured to receive the third bias signal and amplify the radio frequency signal;
- a first low-dropout regulator configured to generate the first reference voltage according to a supply voltage; and
- a second low-dropout regulator configured to generate the second reference voltage according to the supply voltage.

* * * * *